United States Patent [19]
Patalong

[11] Patent Number: 4,464,673
[45] Date of Patent: Aug. 7, 1984

[54] SEMICONDUCTOR COMPONENT

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 252,338

[22] Filed: Apr. 9, 1981

[30] Foreign Application Priority Data

May 14, 1980 [DE] Fed. Rep. of Germany ....... 3018499

[51] Int. Cl.$^3$ .................... H01L 29/74; H01L 29/747
[52] U.S. Cl. ...................... 357/38; 357/39; 357/86; 307/305
[58] Field of Search ............... 357/38 E, 38 G, 38 C, 357/38 S, 38 T, 39, 35, 86; 307/252 R, 252 P, 252 G, 252 C, 305

[56] References Cited

U.S. PATENT DOCUMENTS

| | | | |
|---|---|---|---|
| 3,243,669 | 3/1966 | Sah | 357/38 |
| 3,891,866 | 6/1975 | Okuhara et al. | 357/38 |
| 4,115,707 | 9/1978 | Kalfus | 307/252 C |
| 4,224,634 | 9/1980 | Svedberg | 357/86 |
| 4,244,000 | 1/1981 | Ueda et al. | 357/38 |

FOREIGN PATENT DOCUMENTS 2438894 2/1976 Fed. Rep. of Germany .
2825794 12/1979 Fed. Rep. of Germany ........ 357/38

OTHER PUBLICATIONS

Baliga, "Enhancement and Depletion Mode Vertical Channel M.O.S. Gated Thyristors", *Electronics Letters*, vol. 15, No. 20, Sep. 1979, pp. 645-647.

*Primary Examiner*—Andrew J. James
*Assistant Examiner*—J. L. Badgett
*Attorney, Agent, or Firm*—Hill, Van Santen, Steadman & Simpson

[57] ABSTRACT

A semiconductor component, which may be configured as a diac or triac or the like, has a semiconductor body comprising four layers of alternating conductivity type, in which an outer n-emitter carries a cathode, an outer p-emitter carries an anode, and two base layers are respectively adjacent and between the emitter layers. The anode and cathode respectively have terminals for an external circuit and a metal-insulator-semiconductor structure is disposed adjacent the n-emitter layer (p-emitter layer), the metal-insulator-semiconductor structure being provided with a gate electrode insulated from the boundary surface of the semiconductor body and representing a controllable emitter short circuit. A resistor is connected to the cathode (anode) and is connected in an external circuit in series with the cathode terminal (anode terminal). The gate electrode of the metal-insulator-semiconductor structure is connected to that terminal of the resistor which is opposite to the terminal connected to the cathode (anode).

8 Claims, 5 Drawing Figures

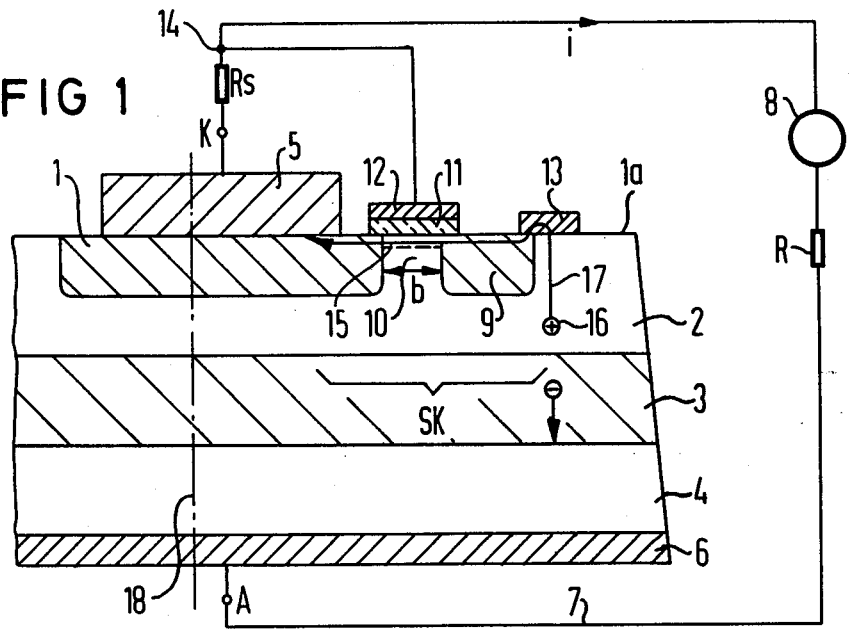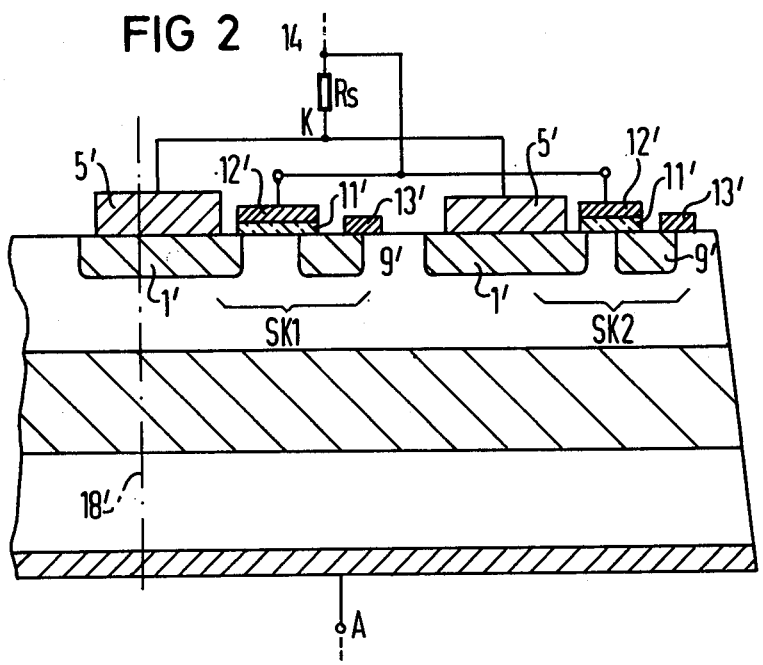

SEMICONDUCTOR COMPONENT

BACKGROUND OF THE INVENTION

1. Field of the Invention

The present invention relates to a semiconductor component, and more particularly to a semiconductor component having a semiconductor body exhibiting four layers of alternating conductivity type, in which an outside n-emitter layer has a cathode contact, an outer p-emitter layer has an anode contact, and two base layers are provided respectively adjacent and between the outer emitter layers, and in which the anode and cathode respectively have terminals for an external circuit, and in which a metal-insulator-semiconductor structure is disposed adjacent the n-emitter layer (p-emitter layer), the metal-insulator-semiconductor structure being provided with a gate electrode insulated from the boundry surface of the semiconductor body and representing a controllable emitter short-circuit.

2. Description of the Prior Art

A component is known from U.S. Pat. No. 3,243,669, fully incorporated herein by this reference, of such type that, given a voltage poled in the forward conducting direction applied between the anode and cathode, the component is either conditioned to a first switching state in which it is low-resistant and current-conducting or in a second switching state, which is also designated as the block state, in which practically no current flows between the anode and cathode. The metal-insulator-semiconductor (MIS) structure thereby comprises a p-conductive zone extending from a boundary surface and disposed adjacent the p-emitter layer, a part of the p-emitter layer at the edge side and of the gate electrode insulated from and covering the boundary surface between the two aforementioned portions, whereby the p-conductive zone is embedded in the n-base layer and is connected to the n-base layer by a conductive coating located on the boundary surface. Upon the application of a control voltage to the gate electrode, a short circuit path is switched operative, the short circuit path bridging the pn junction between the p-emitter layer connected to the anode and the adjacent n-base layer. This action results in switching from the current-conducting state into the blocked state. The transition from the blocked into the current-conductive state occurs by a bridging of the pn junction between the p-base layer and the n-base layer by a further MIS structure which is also provided with a gate electrode.

It is also known from the German allowed and published application No. 24 38 894 to provide a semiconductor component of the type mentioned above with fixed emitter short circuits which comprise projections of the p-base layer which are conductively connected to the cathode. These effect a good stabilization of the component, i.e. high security against unintentional trigger operations give occurrence of voltages at the anode/cathode segment which are poled in the forward conducting direction, the voltages sometimes arising very quickly (high dU/dt loads).

What is disadvantageous is that the emitter short circuits required because of good stabilization easily lead to thermal overloads of the component given intentional or unintentional trigger operations. In the transition from the blocked state into the current-conducting state, in particular, a very thin current path is first formed between the anode and cathode, the path then subsequently expanding until the entire cross-section of the semiconductor component becomes current-conducting. The propagation speed of the edge of the respectively current-conducting surface, as measured in the boundary surface containing the n-emitter layer or the p-emitter layer, amounts to only approximately 0.01–0.1 mm/μs given components provided with emitter short circuits. This, however, leads to high turn-on losses, and, therefore, to a lower current load capacity.

SUMMARY OF THE INVENTION

The object of the present invention, therefore, is to provide a semiconductor component of the type generally set forth above which, on the one hand, exhibits good stability and, on the other hand, exhibits a high trigger propagation velocity and, therefore, a high capacity for current loading.

The above object is achieved, in a structure of the type set forth above, in that the gate electrode is connected to a terminal of a resistor which has its opposite terminal connected to the cathode (anode), the resistor being connected in the external circuit in series with the cathode terminal (anode terminal).

The advantage which can be achieved in practicing the present invention is that the intentional transition from the blocked state into the current-conducting state, or the unintentional transition upon occurrence of a high blocking voltage, is accomplished with significantly greater speed than with components heretofore known. By driving the gate electrode(s) of the MIS structure(s) via the resistor in series with the cathode terminal (anode terminal), an automatic cancellation of the emitter short circuits formed by the MIS structures occurs as the function of the load current traversing the component. Therefore, the energy density which is first very high given high load currents in the semiconductor region which is triggered first is reduced significantly more quickly than in conventional components of this type to a value which exists in the fully-triggered state of the component.

BRIEF DESCRIPTION OF THE DRAWINGS

Other objects, features and advantges of the invention, its organization, construction and operation will be best understood from the following detailed description, taken in conjunction with the accompanying drawings, on which:

FIG. 1 is a sectional view of an exemplary embodiment of the invention;

FIG. 2 is a sectional view of a further development of the first embodiment illustrated in FIG. 1;

DESCRIPTION OF THE PREFERRED EMBODIMENTS

Figure 3:
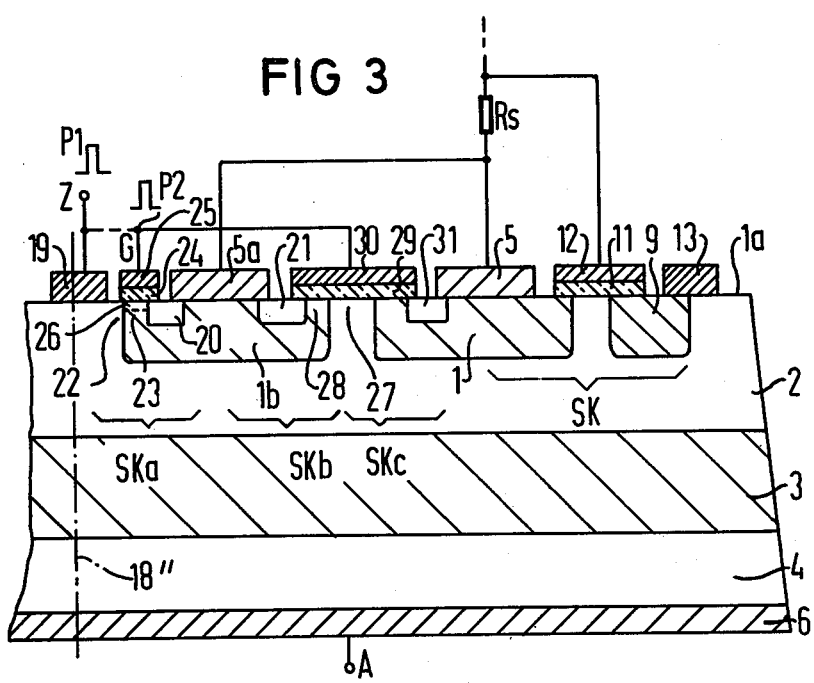
FIG. 3 is a sectional view of a second embodiment of the invention.

The semiconductor component illustrated in FIG. 1 comprises a semiconductor body which includes, for example, silicon having four layers of alternating conductivity type. An outer n-conductive layer 1 is designated as the n-emitter layer and an outer, p-conductive layer 4 is designated as the p-emitter layer. A p-conductive layer 2 represents a p-base layer and an n-conductive layer 3 is an n-base layer. The n-emitter layer 1 is provided with a cathode 5 which has a cathode terminal K, whereas the p-emitter 4 is contacted with an anode 6 having an anode terminal A. An external circuit 7 includes a load resistor R and a d.c. or a.c. voltage source 8 is connected via the load resistor R to the terminal A and via a resistor Rs to the terminal K.

An n-conductive zone 9 which extends up to the boundary surface 1a of the semiconductor body is provided in the p-base layer 2 adjacent the n-emitter layer 1. Between the zone 9 and the right-hand edge of the n-emitter zone 1, there is a p-intermediate layer 10 having a width b which consists of a portion of the p-base layer 2. The boundary surface 1a is covered above the p-intermediate layer 10 by a thin-electrically-insulating layer 11. A gate electrode 12, consisting, for example, of aluminum or highly-doped polycrystalline, is located on the layer 11. The pn junction between the zone 9 and the p-base layer 2 is bridged by a conductive coating 13. As mentined above, the Rs is inserted in the external circuit 7 in series with the cathode terminal K, the terminal 14 of the resistor Rs facing away from the cathode 5 and connected to the gate electrode 12.

The n-conductive semiconductor elements 1 and 9, together with the p-intermediate layer 10 and the gate electrode 12 applied to the insulating layer 11, represent an MIS structure of the depletion type. This means that, given identical potential of the cathode 5 and the gate 12, an n-conductive channel 15 exists at the boundary surface 1a in the region of the p-intermediate layer 10. Under the influence of an blocking voltage exerted by the source 8 between the terminals A and K, given which the anode lies at a higher potential than the cathode, a short circuit path 17 arises for the positive charge carrier 16 from the p-base layer 2, the short circuit path extending across the elements 13, 9, 15 and 1 to the cathode 5. The short circuit path 17 represents a controllable inner short circuit SK which includes the channel 15 as the actual contact break distance. Whether or not the emitter short circuit 17 is switched operative or inoperative depends on the presence or non-presence of the channel 15.

In the blocked state of the semiconductor component illustrated in FIG. 1, which is also called a Shockley diode, the short circuit paths 17 is switched operative because of the existence of the channel 15 and thus prevents triggering up to high blocking voltages. It is only when the break-down voltage is reached that a current path is formed between the cathode 5 and the anode 6, in which path positive charge carriers 16 move from the p-base layer 2 to the pn junction between the layers 1 and 2 and there produce an injection of negative charge carriers from the layer 1 into the layer 2. At the same time, when the space charge zone is built up between the layers 2 and 3, electrons are displaced from the n-base into the p-emitter and there effect an injection of holes. The load current i thereby arising causes a voltage drop off at the resistor Rs, the voltage negatively biasing the gate electrode 12 with respect to the cathode 5. By so doing, however, the n-conductive channel 15 is eliminated so that, when the emitter short circuit is switched inoperative, a very rapid propagation of the current-conducting or, respectively, triggered surface occurs in a lateral direction over the entire cross-section of the component. A shut-down of the emitter short circuit present in the blocked state for reasons of stabilization therefore occurs automatically as a function of the load current i occurring upon the transition from the blocked state into the current-conducting state. Therefore, the energy densities which are produced in the current paths permeating the semiconductor body when the load current i begins are practically immediately lowered to those values which exists when the triggered surface extends to the entire cross-section of the semiconductor body.

The n-emitter layer 1 and the n-conductive zone 9 can be designed longitudinally extended, whereby their greater dimensions extend perpendicularly to the plane of the drawing of FIG. 1. The elements 5, 11, 12 and 13 are then advantageously likewise designed longitudinally extended so that they extend practically over the entire boundary surface 1a. Thereby, the format can be symmetrical with respect to a plane which is perpendicular to the plane of the drawing and is indicated by a line 18. In this case, a further, controllable short circuit is provided to the left of the line 18, the gate electrode of the further emitter short circuit likewise being connected to the terminal 14. On the other hand, a rotationally-symmetrical format of the semiconductor component of FIG. 1, with the line 18 as the axis of symmetry, is also advantageous. Thereby, the parts 1-5 are designed as disc-shaped elements, whereas the elements 9, 11, 12 and 13 are designed in the form of annular rings and are concentrically disposed with respect to the elements 1-5.

FIG. 2 illustrates a further development of the semiconductor component of FIG. 1 in which the n-emitter layer 1 is divded into two n-emitter zones 1'. An n-conductive zone 9' is provided adjacent each of the n-emitter zones 1', the n-conductive zones 9' being expanded by respective elements 11'-13', which elements are described with respect to FIG. 1, into controllable emitter short circuits SK1 and SK2. Here, also, the line 18' can again be interpreted as a plane of symmetry or as an axis of symmetry. Instead of the two n-emitter zones illustrated in FIG. 2, a larger plurality can also be provided.

In addition to the circuit elements already described on the basis of FIG. 1 and here provided with the same reference symbols, an exemplary embodiment is illustrated in FIG. 3 which exhibits a trigger electrode 19 which is disposed on the p-base layer 2 and has a terminal Z for a trigger current circut. Therefore, in this exemplary embodiment, a thyristor is disclosed. The p-conductive semiconductor regions 20 and 21 are inserted in an additional n-emitter zone 1b and extend up to the boundary surface 1a and are contacted at the boundary surface by a cathode portion 5a, as is the zone 1b. The cathode portion 5a is, in turn, conductively connected to the cathode 5. Together with the portion 22 of the p-base layer and the portion 23 of the zone 1b, the semiconductor region 20 forms a lateral pnp structure which is expanded into an MIS structure of the depletion type by means of a thin insulating layer 24 and a gate electrode 25 covering the insulating layer 24 and insulated thereby from the n-zone 23. Without supplying a voltage to the control voltage terminal G of the gate electrode 25, a channel 26 connecting the portions 20 and 22 to one another exists in the portion 23 of the zone 1b. Since the region 20 is connected to the cathode portion 5a, there occurs an emitter short circuit SKa which can be controlled by way of the terminal G and which, given the existence of the channel 26, bridges the pn junction between the zone 1b and the p-base layer 2. In an analogous manner, the region 21, the portion 27 of the p-base layer 2 and the portion 28 of the zone 1b form a futher pnp structure which is expanded into a further emitter short circuit SKb by means of a gate electrode 30 which is applied to an insulating layer 29 and connected to the terminal G. Finally, yet another emitter short circuit SKc is constructed by means of a p-conductive semiconductor region 31 located in the n-emitter layer 1 and by means of portions 29 and 30 on the right-hand side.

The emitter short circuits Ska-Skc switched operative given a voltage-free terminal G stabilize the thyristor, together with the likewise operatively-switched emitter short circuit SK against high blocking voltages. Given the supply of a trigger pulse P1 to the terminal Z, the triggering occurs. At the same time as the pulse P1, a positive pulse P2 is applied to the terminal G which effects the shut-down of the short circuits SKa-SKc. This shut-down results in a fast propagation of the triggered surface in the lateral direction over the cross-section of the thyristor. With the increase of the load current i through the resistor Rs, however, the emitter short circuit SK is likewise switched inoperative so that the fast propagation of the triggered surface is thereby likewise promoted. Thereby, it is to be taken into consideration that the control of the short circuits SKa-SKc occurs by way of a pulse P2 supplied to the terminal G, but the control of the short circuit SK automatically occurs via the voltage drop at the resistor Rs. Even given unintentional trigger operations, i.e. without a corresponding drive at the terminals Z and G, the shut-down of the short circuit SK effects a fast surface-wide triggering which protects the thyristor against thermal destruction. Such a thyristor can also be precipitously triggered without being destroyed, so that no voltage-limiting elements need be provided in parallel thereto. Moreover, it can be advantageous to connect the terminal G to the terminal Z. In this case, the trigger voltage pulse occurring at the terminal Z as a result of the trigger pulse P1 is exploited for the control of the terminal G. The line 18'' can here, again, be interpreted as the indication of a plane of symmetry or as an axis of symmetry.

Figure 4:
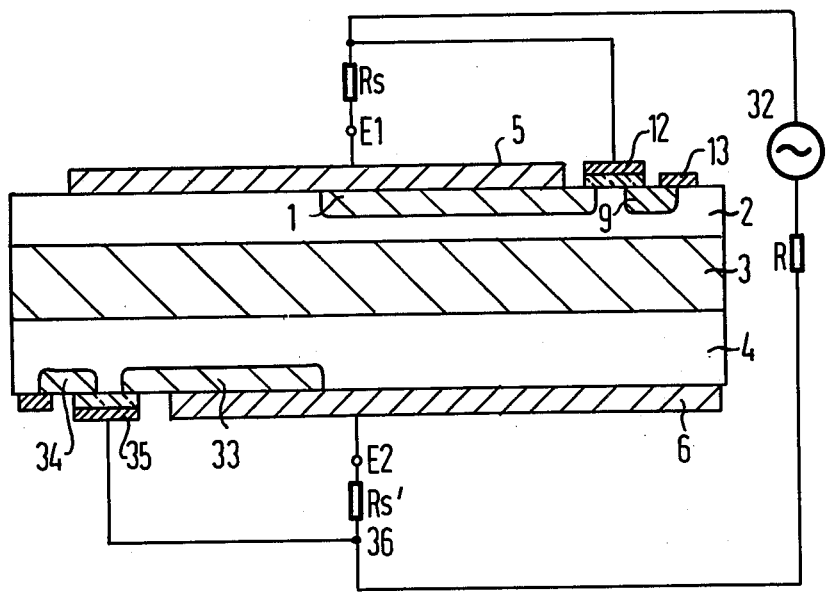
FIG. 4 is a sectional view of a third embodiment of the invention.

FIG. 4 illustrates a semiconductor component, also called a diac, which corresponds to an antiparallel connection of two components according to FIG. 1. In FIG. 4, therefore, the right-hand portion corresponds to the arrangement according to FIG. 1, whereby the only change is that the terminals A and K are now referenced E1 and E2. An alternating voltage source is referenced 32 in FIG. 4. A resistor Rs', which corresponds to the resistor Rs, is connected in series with the terminal E2. For the anti-system illustrated at the left, the extended p-base layer 2 represents the p-emitter layer, the extended layer 3 represents the n-base layer and the extended layer 4 represents the p-base layer, whereby an n-emitter layer 33 and an n-conductive zone 34 are included in the p-base layer 4. The cathode system 5 of the right-hand system simultaneously represents the anode of the left-hand system and the anode 6 of the right-hand system simultaneously represents the cathode of the left-hand system. The gate electrode 35 of the left-hand system is connected to that terminal 36 of the resistor Rs' which faces away from the terminal 6. In the component according to FIG. 4, the right-hand system behaves like an arrangement according to FIG. 1 for one half-wave of the alternating voltage emitted by the source 32, the arrangement being charged with voltages poled in the forward conducting direction, whereas the left-hand system operates in a corresponding manner upon occurrence of the other half-wave of the voltage of the source 32. A very rapid propagation of the initially-triggered surface over the entire cross-section of the respective system occurs for both half-waves.

Figure 5:
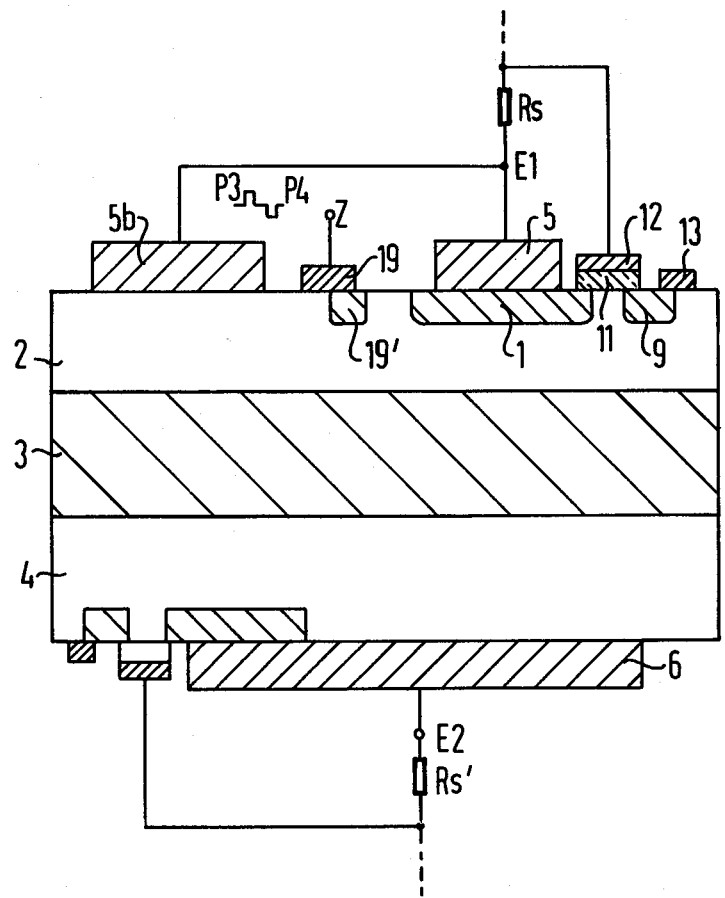
FIG. 5 is a sectional view of a fourth embodiment of the invention.

An exemplary embodiment of the invention is illustrated in FIG. 5 which represents a triac which is formed of an antiparallel connection of two components according to FIG. 3. The right-hand system again corresponds to the arrangement according to FIG. 3, whereby, for the purpose of simplification, the zone 1b and the elements 5a, 24, 25 and 29-31 have been omitted. An n-conductive region 19' is located in the p-base layer 2 below a portion of the trigger electrode 19. The structure of the component according to FIG. 5 corresponds to FIG. 4 with the difference that the upper electrode 5 of FIG. 4 is divided into two portions 5 and 5b which are conductively connected to one another and between which the trigger electrode 19 is located. During one half-wave of an alternating voltage source 32, likewise here connected in accordance with FIG. 4, the right-hand system of FIG. 5 operates in the same manner as the thyristor of FIG. 3 under the influence of voltages poled in the forward conducting direction, whereby the turn-on assistance by means of the controllable emitter short circuits SKa-SKc can also be employed here, whereas the left-hand system of FIG. 5 operates in a corresponding manner during the other half-wave from the source 32. The drive of the trigger electrode 19 occurs with pulses P3 and P4 of different polarity, whereby the pulse P3 corresponds to the pulse P1 for the right-hand system and the pulse P4 corresponds to the pulse P1 for the left-hand system.

Within the framework of the invention, the p-emitter layer 4 can also be bridged instead of the n-emitter layer 1 by means of one or more controllable short circuits SK. FIGS. 1-5 can be employed in order to illustrate this circuit variation if the reference symbols of the terminals A and K are mutually interchanged and the semiconductor portions 1-4, 9, 20, 21, 31, 33 and 34 receive the respectively opposite conductivity types. Thereby, the pulses P1-P4 respectively exhibit the opposite polarities.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a semiconductor circuit arrangement of the type in which a semiconductor component includes a semiconductor body which comprises a first base of a first conductivity type on a second base of a second conductivity type, a first emitter of the second conductivity type in the first base and having a surface coplanar with the boundary surface of the semiconductor body, a second emitter on the second base on the side opposite the first base, a first electrode on the first emitter and a second electrode on the second emitter for connection across an external circuit including a voltage source, and at least one metal-insulator-semiconductor controllable emitter short circuit including a gate electrode, said metal-insulator-semiconductor controllable emitter short circuit comprising a zone of second conductivity type in said first base extending up to the boundary surface and spaced from said first emitter, an edge portion of said first emitter, and the gate electrode carried on the boundary surface over respective sections of the zone and the edge portion and over the portion of the first base therebetween, the improvement therein comprising:
    a resistor including a first terminal connected to the first electrode and a second terminal for connection to the external circuit so that said resistor is in series with the component and the voltage source; and
    conductor means directly connecting said second terminal of said resistor to said gate electrode of said metal-insulator-semiconductor controllable emitter short circuit.

2. The improved semiconductor circuit arrangement of claim 1, wherein:
    said first emitter is of p conductivity.

3. The improved semiconductor circuit arrangement of claim 1, wherein:
    said first emitter is of n conductivity.

4. The improved semiconductor circuit arrangement of claim 1, wherein:
    the first emitter comprises a plurality of spaced apart emitter regions;
    the first electrode comprises a plurality of first electrode sections on respective emitter regions and each connected to the first terminal of said resistor; and a plurality of the metal-insulator-semiconductor controllable emitter short circuits for respective emitter regions, each including a gate electrode connected to said second terminal via said conductor means.

5. The improved semiconductor circuit arrangement of claim 1, and further comprising:
    a trigger electrode on one of the bases.

6. In a semiconductor circuit arrangement of the type in which a semiconductor component includes a semiconductor body which comprises a first base of a first conductivity type on a second base of a second conductivity type, a first emitter of the second conductivity type in the first base and having a surface coplanar with the boundary surface of the semiconductor body, a second emitter on the second base on the side opposite the first base, a first electrode on the first emitter and a second electrode on the second emitter for connection across an external circuit including a voltage source, and a metal-insulator-semiconductor controllable emitter short circuit including a gate electrode, a zone of the second conductivity type in the first base extending up to the boundary surface and spaced from the first emitter, an edge portion of the first emitter, and the gate electrode carried insulated on the boundary surface over respective sections of the zone and the edge portion and over the portion of the first base therebetween, the imporvement therein comprising:
    a resistor including a first terminal connected to the first electrode and a second terminal for connection to the external circuit so that said resistor is in series with the component and the voltage source;
    conductor means directly connecting said second terminal of said resistor to said gate electrode;
    the first emitter including two emitter regions in the first base, the gate electrode covering said edge portion of one of said emitter regions,
    an additional metal-insulator-semiconductor controllable emitter short circuit including an additional gate electrode carried insulated over the first base and covering a respective edge portion of the other emitter region for receiving a control voltage.

7. The improved semiconductor circuit arrangement of claim 6, and further comprising:
    a trigger electrode carried on one of the base layers and connected to said additional gate electrode.

8. A semiconductor circuit arrangement comprising:
    a first semiconductor layer of a first conductivity type;
    a second semiconductor layer of a second conductivity type adjacent said first semiconductor layer;
    a first zone of semiconductor material in said first layer and having the second conductivity type;
    a third semiconductor layer of the first conductivity type adjacent said second layer;
    a second zone of semiconductor material in said third layer and having the second conductivity type;
    first and second electrodes on said first zone and first layer and on said second zone and said third layer, respectively, for connection to an external voltage source;
    first and second metal-insulator-semiconductor controllable short circuits each including respective portions of said first zone and first layer and said second zone and said third layer, and a futher zone of the second conductivity type in the respective first and third layer and spaced from the first and second zones, and each including an insulated gate electrode bridging said zones in said first and third layers, respectively; and
    first and second resistors each including a first terminal connected to said first and second electrodes, respectively, and a second terminal directly connected to the respective gate electrode,
    said resistors being connected in an external circuit which includes the external voltage source.

* * * * *